(12) United States Patent
Lee et al.

(10) Patent No.: US 8,138,483 B2
(45) Date of Patent: Mar. 20, 2012

(54) METHOD OF MEASURING PHASE OF PHASE SHIFT MASK

(75) Inventors: Dong-Gun Lee, Hwaseong-si (KR); Seong-Sue Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 228 days.

(21) Appl. No.: 12/489,600

(22) Filed: Jun. 23, 2009

(65) Prior Publication Data

US 2010/0001199 A1    Jan. 7, 2010

(30) Foreign Application Priority Data

Jul. 2, 2008  (KR) .................. 10-2008-0063979

(51) Int. Cl.
*G01J 1/42* (2006.01)

(52) U.S. Cl. .......... 250/372; 356/450; 356/51; 356/503; 382/149

(58) Field of Classification Search .................. 382/149; 356/450, 51, 503
See application file for complete search history.

(56) References Cited

U.S. PATENT DOCUMENTS

| 7,042,577 B1 * | 5/2006 | Jacob et al. .................. 356/511 |
| 2007/0292772 A1 * | 12/2007 | Charpin-Nicolle et al. ...... 430/5 |

FOREIGN PATENT DOCUMENTS

| JP | 2003227914 A | 8/2003 |
| KR | 1020020002920 A | 1/2002 |
| KR | 1020080004547 A | 1/2008 |

* cited by examiner

*Primary Examiner* — David Porta
*Assistant Examiner* — Hugh H Maupin
(74) *Attorney, Agent, or Firm* — Volentine & Whitt, PLLC

(57) ABSTRACT

In a method of measuring a phase of a phase shift mask, initial extreme ultraviolet (EUV) light is divided into secondary EUV light portions. The secondary EUV light portions are irradiated onto the phase shift mask as incident EUV light portions, and the phase of the phase shift mask is measured from reflected incident EUV light portions.

8 Claims, 3 Drawing Sheets

US 8,138,483 B2

METHOD OF MEASURING PHASE OF PHASE SHIFT MASK

PRIORITY STATEMENT

This application claims priority under 35 U.S.C. §119 to Korean Patent Application No. 2008-63979 filed on Jul. 2, 2008, the subject matter of which is hereby incorporated by reference.

BACKGROUND

Embodiments of the inventive concept relate to methods of measuring the phase of a phase shift mask and an apparatus performing such methods. More particularly, embodiments relate to a method of measuring the phase of a phase shift mask using extreme ultraviolet light, and an apparatus performing such methods.

The fabrication of contemporary semiconductor devices requires the use of many different fabrication processes. Some process types commonly used in the fabrication of densely integrated semiconductor devices employ a so-called phase shift mask. A phase shift mask includes a phase shift layer pattern which generally replaces the chrome layer used in other types of masks. For example, phase shift masks are commonly used in conjunction with certain lithography processes conducted with light having one or more wavelengths in the extreme ultraviolet (EUV) range (i.e., a EUV lithography process).

In order to accurately form minute circuit patterns on a semiconductor substrate using an EUV lithography process, it is necessary to precisely measure the phase of the constituent phase shift mask. At lower incident wavelengths, the phase of a phase shift mask may be accurately determined by dividing off a portion of phase impressioned light to a measurement circuit. Unfortunately, it is very difficult, if not practically impossible, to divide EUV light using conventional beam splitters. That is, because most of the EUV light is refracted from a beam splitter, a great portion of EUV light will not penetrate or pass through a beam splitter. Accordingly, the phase of the phase shift mask may not be effectively measured using the EUV light. As a result, the desired circuit pattern may not be correctly formed on a semiconductor substrate by using the phase shift mask.

SUMMARY

Embodiments of the inventive concept provide a method of measuring the phase of a phase shift mask using light in the EUV band.

Embodiments also provide an apparatus for performing this type of measurement method.

According to an embodiment, there is provided a method of measuring a phase of a phase shift mask. The method comprises; dividing initial extreme ultraviolet (EUV) light into secondary EUV light portions, irradiating the secondary EUV light portions onto the phase shift mask as incident EUV light portions, and measuring the phase of the phase shift mask from reflected incident EUV light portions reflected from the phase shift mask.

In a related aspect, the initial EUV light is divided into secondary EUV light portions comprises by passing the initial EUV light through a plurality of pinholes.

In another aspect, irradiating the secondary EUV light portions onto the phase shift mask as incident EUV light portions comprises; reflecting the secondary EUV light portions back towards the phase shift mask, and directing the reflected secondary EUV light portions towards the phase shift mask as the incident EUV light portions.

In another aspect, reflecting the secondary EUV light portions back towards the phase shift mask comprises; controlling a reflection angle for a first mirror, such that the reflected secondary EUV light portions are directed to a location above a path of the secondary EUV light portions.

In yet another aspect, directing the reflected secondary EUV light portions towards the phase shift mask as the incident EUV light portions comprises; controlling a reflection angle for a second mirror, such that the incident EUV light portions are directed to the phase shift mask at an incident angle ranging from between about 2° to 10° relative to a vertical axis perpendicular to a primary upper surface of the phase shift mask.

In yet another aspect, measuring the phase of the phase shift mask from reflected incident EUV light portions reflected from the phase shift mask comprises; detecting the reflected incident EUV light portions, obtaining an interference fringe from the detected, reflected incident EUV light portions, and measuring a shift in the obtained interference fringe in relation to a reference interference fringe.

In another embodiment, a method of measuring a phase of a phase shift mask comprises; passing initial EUV light in a horizontal direction through a plurality of pinholes to divide the initial EUV light into secondary EUV light portions, reflecting the secondary EUV light portions back towards the phase shift mask, directing the reflected secondary EUV light portions towards the phase shift mask as incident EUV light portions, detecting reflected incident EUV light portions reflected from the phase shift mask, obtaining an interference fringe from the detected, reflected incident EUV light portions, and measuring a shift in the obtained interference fringe in relation to a reference interference fringe.

In yet another embodiment, an apparatus for measuring a phase of a phase shift mask, the apparatus comprises; a dividing unit configured to divide initial EUV light into secondary EUV light portions, an irradiating unit configured to generate incident EUV light portions and irradiate the phase shift mask with the incident EUV light portions, and a measuring unit configured to measure the phase of the phase shift mask from reflected incident EUV light portions reflected from the phase shift mask.

In yet another embodiment, an apparatus for measuring a phase of a phase shift mask comprises; a dividing unit configured to divide initial EUV light into secondary EUV light portions by passing the initial EUV light through a plurality of pinholes, an irradiating unit configured to generate incident EUV light portions and irradiate the phase shift mask with the incident EUV light portions, wherein the irradiating unit comprises a concave mirror reflecting the secondary EUV light portions back towards the phase shift mask, and a planar mirror arranged above the phase shift mask and directing the reflected secondary EUV light portions towards the phase shift mask as the incident EUV light portions, and a measuring unit configured to measure the phase of the phase shift mask from reflected incident EUV light portions reflected from the phase shift mask, wherein the measuring unit comprises; a detecting unit configured to detect reflected incident EUV light portions reflected from the phase shift mask, a receiving unit configured to obtain an interference fringe from the detected, reflected incident EUV light portions, and a measuring unit configured to measure a shift from the obtained interference fringe in relation to a reference interference fringe.

BRIEF DESCRIPTION OF THE DRAWINGS

Embodiments of the inventive concept may be clearly understood from the following detailed description taken in conjunction with the accompanying drawings.

FIG. 1 is a front view of an apparatus for measuring the phase of a phase shift mask in accordance with an embodiment of the inventive concept;

FIG. 2 is a front view of an apparatus for measuring the phase of a phase shift mask in accordance with another embodiment of the inventive concept; and FIG. 3 is a flow chart summarizing a method of measuring the phase of the phase shift mask using the apparatus of FIG. 1.

DESCRIPTION OF EMBODIMENTS

Figure 1:
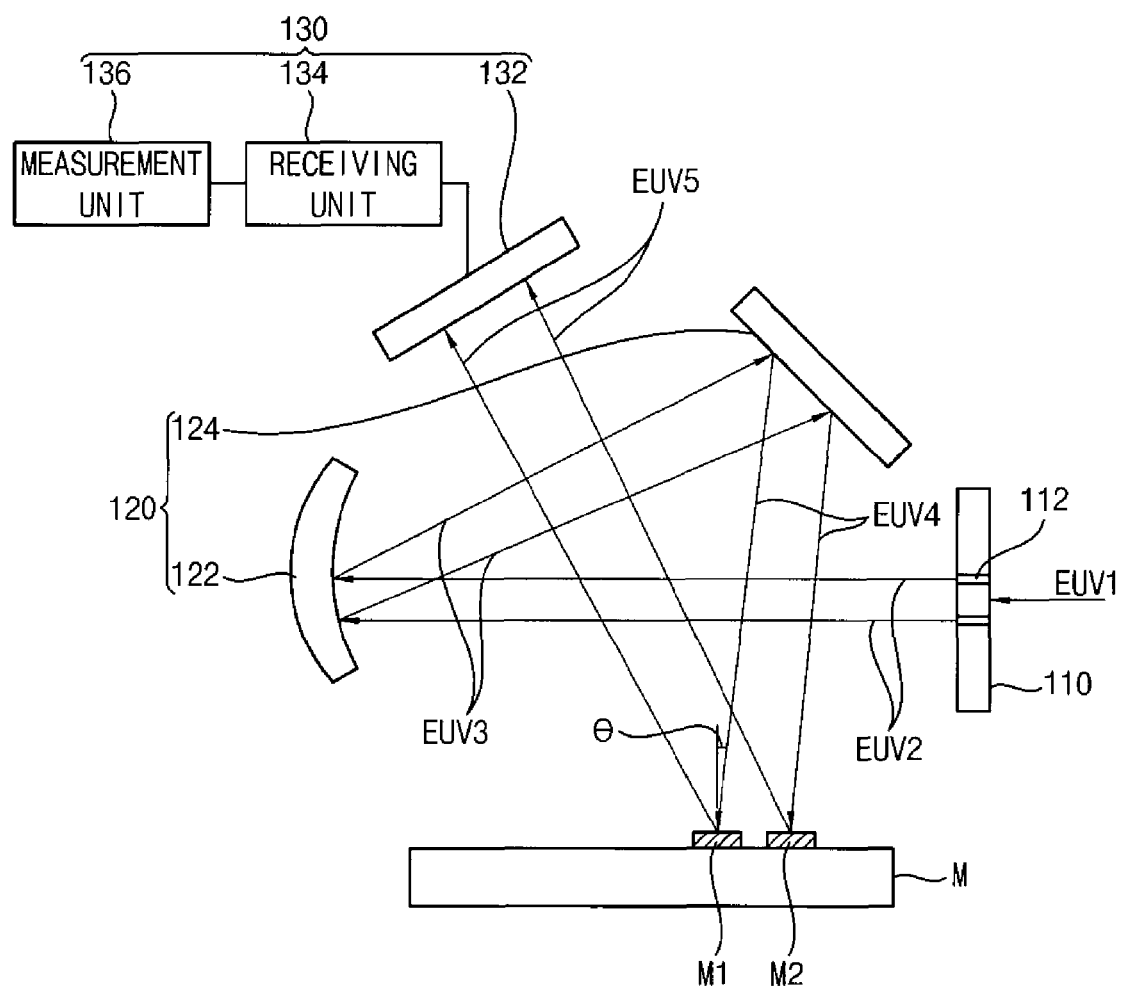
FIGS. 1 to 3 illustrate selected example embodiments described herein.

Various example embodiments will be described in some additional detail with reference to the accompanying drawings. The present invention may, however, be embodied in many different forms and should not be construed as being limited to only the illustrated embodiments. Rather, the illustrated embodiments are presented as teaching examples.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a front view of an apparatus for measuring the phase of a phase shift mask in accordance with an embodiment of the inventive concept. Referring to FIG. 1, the apparatus 100 generally comprises a dividing unit 110, an irradiating unit 120 and a measuring unit 130.

The dividing unit 110 divides initial EUV light (EUV1) generated by a source into at least two (2) secondary EUV light portions (EUV2). In certain embodiments, the dividing unit 110 includes a dividing plate having pinholes 112 through which the initial EUV light (EUV1) passes. As the horizontally applied, initial EUV light (EUV1) passes through the pinholes 112, it is divided into two (2) secondary EUV light portions (EUV2). Thus, in the illustrated embodiment, the dividing unit 110 is arranged in a direction substantially perpendicular to the path of the initial EUV light (EUV1). The two (2) secondary EUV light portions (EUV2) passing through the pinholes 112 have paths substantially parallel to one another and parallel to that of the initial EUV light (EUV1). In one embodiment, the pinholes 112 comprise two (2) pinholes arranged along a vertical axis of the dividing unit 110. Alternatively, the two (2) pinholes 112 may be arranged along the horizontal axis of the dividing unit 110.

The initial EUV light (EUV1) may be generated using a femtosecond laser generator, a focusing mirror and a neon gas cell, for example. The femtosecond laser generator irradiates a femtosecond laser onto the focusing mirror, and the focusing mirror reflects the femtosecond laser towards the neon gas cell. The femtosecond laser thus passes through the neon gas contained in the neon gas cell to generate the initial EUV light (EUV1).

A phase shift mask "M", for example, an EUV mask M is positioned in the path of the two (2) secondary EUV light portions (EUV2). In certain embodiments, the EUV mask M may have an upper surface pattern substantially parallel with the path of the two (2) secondary EUV light portions (EUV2). In certain embodiments, a multilayer M1 and a thin absorbing layer M2 may be formed on the EUV mask.

The irradiating unit 120 of the illustrated embodiment comprises a first mirror 122 and a second mirror 124. The first mirror 122 may include a concave mirror, and the second mirror 124 may include a planar mirror.

The concave mirror 122 is located in a region opposite to the dividing unit 110 with respect to the EUV mask M. In certain embodiments, the concave mirror 122 is arranged in a direction substantially perpendicular to the path of the two (2) secondary EUV light portions (EUV2). Thus, the surface of the concave mirror 122 will angularly reflect the two (2) secondary EUV light portions (EUV2) to the planar mirror 124 which is disposed in a location back towards the EUV mask M. In this configuration, it may generally be said that the dividing unit 110 and planar mirror 124 are disposed "on the EUV mask side" of the apparatus, while the concave mirror 122 is disposed "away from the EUV mask side."

In certain embodiments, the planar mirror 124 may be disposed vertically over the EUV mask M, and vertically above the concave mirror 122. In this configuration, the planar mirror 124 is disposed in the angularly reflected path of the two (2) secondary EUV light portions (EUV2). The reflecting surface of the planar mirror 124 is thus oriented towards the surface of the EUV mask M and directs the reflected, two (2) secondary EUV light portions (EUV3) received from the concave mirror 122 to the EUV mask M.

The twice reflected, two (2) secondary EUV light portions, or "incident EUV light portions" (or EUV4 in the illustrated embodiment of FIG. 1) provided by the planar mirror 124 irradiate the upper surface of the EUV mask M at a defined incident angle θ. In certain embodiments of the inventive concept, the incident angle θ ranges between about 2° to 10°. In one more specific embodiment, the incident angle θ is defined as about 6° with respect to the upper surface of the EUV mask M.

The two (2) parallel incident EUV light portions irradiating the phase shift mask M may be narrowly grouped on the semiconductor substrate by careful arrangement of the concave mirror 122 and the planar mirror 124.

Within this irradiation grouping, the incident EUV light portions (EUV4) may be respectively directed to the multilayer M1 of the EUV mask M and the absorbing layer M2 on the EUV mask M. These respective portions of the EUV mask M reflect "reflected incident EUV light portions" (EUV5) at a reflection angle substantially the same as the incident angle θ.

The measuring unit 130 is configured to measure the phase of the phase shift mask M in relation to (i.e., in response to the optical characteristics of) the reflected EUV light portions (EUV5) reflected from the multilayer M1 and the absorbing layer M2. In certain embodiments, the measuring unit 130 comprises a detecting unit 132, a receiving unit 134 and a measurement unit 136.

The detecting unit 132 detects the reflected incident EUV light portions (EUV5) reflected from the multilayer M1 and the absorbing layer M2. In certain embodiments, the detecting unit 132 may include an X-ray compatible charge coupled device (CCD).

The receiving unit 134 derives an interference fringe characteristic from the reflected incident EUV light portions (EUV5) provided by the detecting unit 132. Because the reflected incident EUV light portions (EUV5) respectively reflected from the multilayer M1 and the absorbing layer M2 will have different diffraction angles, the reflected incident EUV light portions (EUV5) will optically interfere with one another.

The measurement unit 136 measures a shift by comparing the actual interference fringe derived by the receiving unit 134 from a predetermined reference interference fringe. The shift between the derived interference fringe and the reference interference fringe corresponds to the phase of the phase shift mask M. In one approach, the reference interference fringe may be derived from a reference EUV mask without the multilayer and the absorbing layer.

Figure 2:
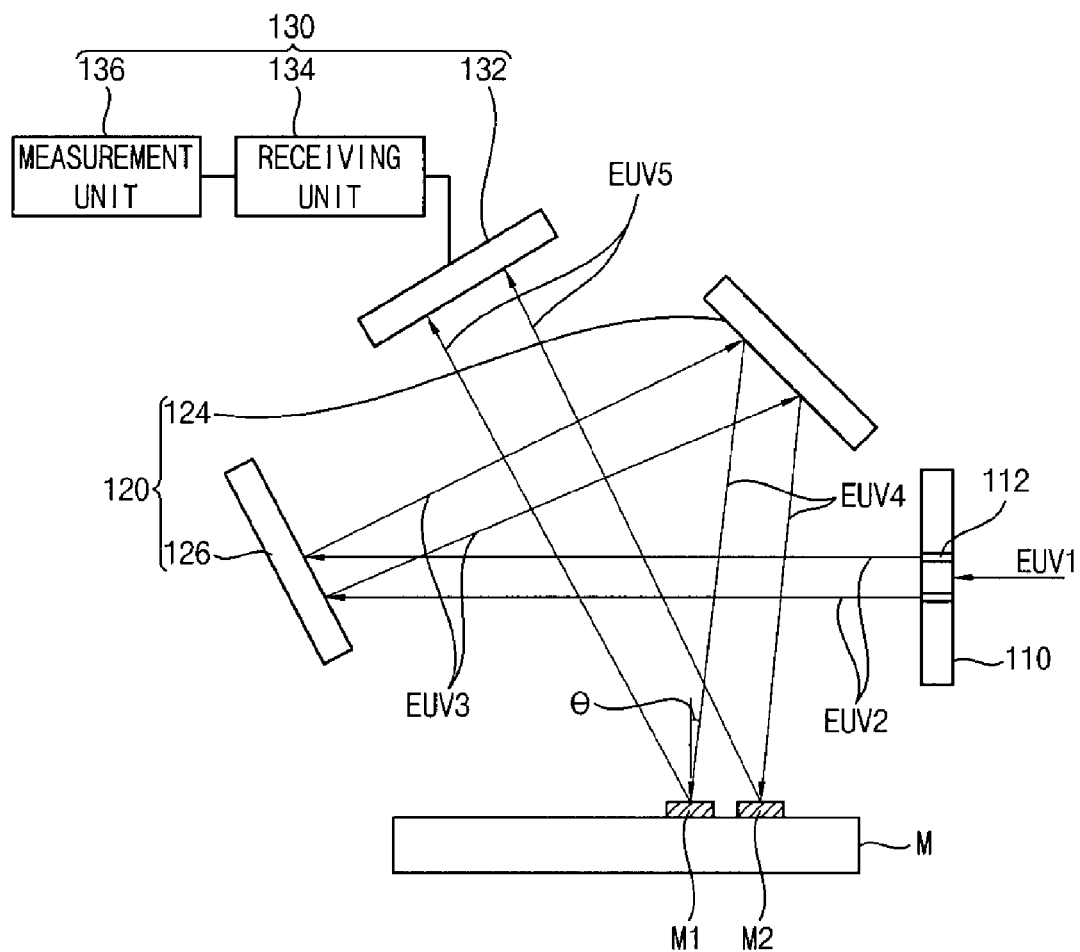

FIG. 2 is a front view of an apparatus for measuring the phase of a phase shift mask in accordance with another embodiment of the inventive concept. The apparatus 100a shown in FIG. 2 comprises substantially the same component as the apparatus 100 of FIG. 1. Only the irradiating unit 121 is different. Thus, similar elements, components, and features from FIG. 1 are similarly labeled in FIG. 2 and have the same description.

Referring to FIG. 2, the irradiating unit 121 of apparatus 100a comprises a first planar mirror 126 and a second planar mirror 124.

In order to reflect the two (2) secondary EUV light portions (EUV2) towards the second planar mirror 124, the first planar mirror 126 is arranged at a defined angle in the path of the two (2) secondary EUV light portions (EUV2).

Figure 3:
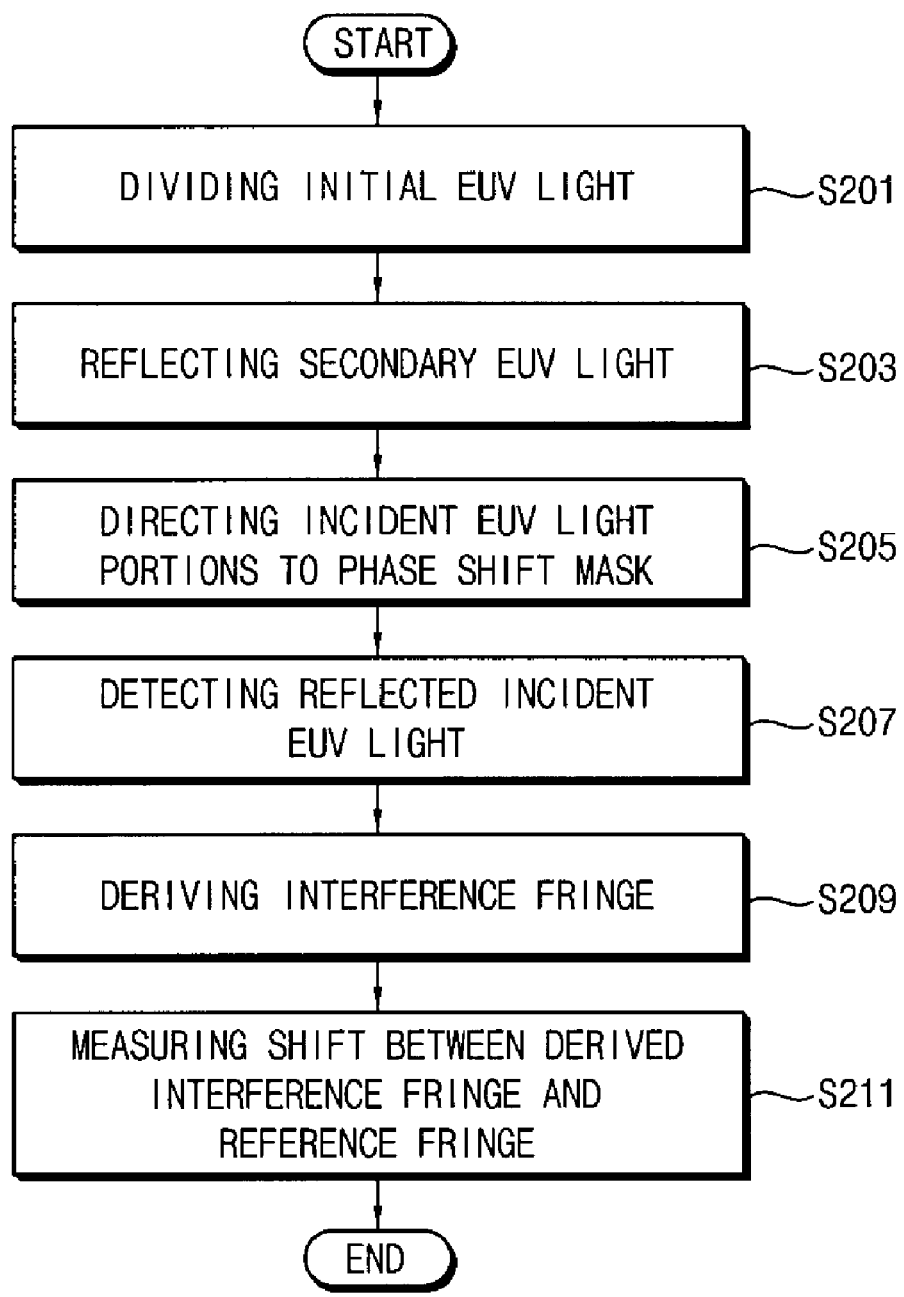

FIG. 3 is a flow chart summarizing a method of measuring the phase of the phase shift mask using the apparatus of FIG. 1.

Referring to FIGS. 1 and 3, the initial EUV light (EUV1) is generated. The initial EUV light (EUV1) is then divided into at least two (2) secondary EUV light portions (EUV2) (S201).

The two (2) secondary EUV light portions (EUV2) are then reflected by (e.g.,) the concave mirror 122 back to the EUV mask side of the apparatus 100 (S203).

Within the irradiating unit 120, the reflected two (2) secondary EUV light portions (EUV3) are used to provide incident EUV light portions (EUV4). These incident EUV light portions (EUV4) are directed to expose upper surface of a phase shift mask M (S205). The incident EUV light portions (EUV4) are reflected as reflected incident EUV light portions (EUV5) from (e.g.,) a multilayer portion M1 and an absorbing layer M2 portion of the phase shift mask M.

The detecting unit 132 detects the reflected incident EUV light portions (EUV5) reflected from phase shift mask M (S207).

The receiving unit 134 obtains or derives an interference fringe from the reflected incident EUV light portions (EUV5) detected by the detecting unit 132 (S209). Here, because the reflected incident EUV light portions (EUV5) reflected from the multilayer M1 and the absorbing layer M2 have different diffraction angles, optical interference arises.

The measurement unit 136 now measures a shift by comparing the obtained interference fringe with a predetermined reference interference fringe (S211). The measured shift between the obtained interference fringe and the reference interference fringe correspond to the phase of the phase shift mask M.

In relation to the method summarized in FIG. 3, the phase of a phase shift mask M was measured using the apparatus 100 shown in FIG. 1. Alternatively, the phase of the phase shift mask M might have been measured using the apparatus 100a of FIG. 2.

According to certain embodiments of the inventive concept, initial EUV light is divided into secondary EUV light portions, and the phase of a phase shift mask is accurately measured using the secondary EUV light portions, as manipulated by a constituent irradiating unit. Incident EUV light portions derived from the secondary EUV light portions may be closely grouped during substrate irradiation by the irradiating unit. As a result, a desired pattern may be precisely formed on a semiconductor substrate using the phase shift mask.

The foregoing is illustrative of example embodiments and is not to be construed as limiting thereof. Although a few example embodiments have been described, those skilled in the art will readily appreciate that many modifications are possible in the example embodiments without materially departing from the teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of measuring a phase of a phase shift mask, the method comprising:
   dividing initial extreme ultraviolet (EUV) light into secondary EUV light portions;
   irradiating the secondary EUV light portions onto the phase shift mask as incident EUV light portions; and
   measuring the phase of the phase shift mask from reflected incident EUV light portions reflected from the phase shift mask
   wherein irradiating the secondary EUV light portions onto the phase shift mask as incident EUV light portions comprises reflecting the secondary EUV light portions back towards the phase shift mask, and directing the reflected secondary EUV light portions towards the phase shift mask as the incident EUV light portions, and
   wherein reflecting the secondary EUV light portions back towards the phase shift mask comprises controlling a reflection angle for a first mirror, such that the reflected secondary EUV light portions are directed to a location above a path of the secondary EUV light portions.

2. The method of claim 1, wherein dividing the initial EUV light into secondary EUV light portions comprises passing the initial EUV light through a plurality of pinholes.

3. A method of measuring a phase of a phase shift mask, the method comprising:
   dividing initial extreme ultraviolet (EUV) light into secondary EUV light portions;
   irradiating the secondary EUV light portions onto the phase shift mask as incident EUV light portions; and
   measuring the phase of the phase shift mask from reflected incident EUV light portions reflected from the phase shift mask
   wherein irradiating the secondary EUV light portions onto the phase shift mask as incident EUV light portions comprises reflecting the secondary EUV light portions back towards the phase shift mask, and directing the reflected secondary EUV light portions towards the phase shift mask as the incident EUV light portions, and
   wherein directing the reflected secondary EUV light portions towards the phase shift mask as the incident EUV light portions comprises controlling a reflection angle for a second mirror, such that the incident EUV light portions are directed to the phase shift mask at an incident angle ranging from between about 2° to 10° relative to a vertical axis perpendicular to a primary upper surface of the phase shift mask.

4. The method of claim 1, wherein measuring the phase of the phase shift mask from reflected incident EUV light portions reflected from the phase shift mask comprises:
   detecting the reflected incident EUV light portions;
   obtaining an interference fringe from the detected, reflected incident EUV light portions; and
   measuring a shift in the obtained interference fringe in relation to a reference interference fringe.

5. A method of measuring a phase of a phase shift mask, the method comprising:
   passing initial EUV light in a horizontal direction through a plurality of pinholes to divide the initial EUV light into secondary EUV light portions;
   reflecting the secondary EUV light portions back towards the phase shift mask;
   directing the reflected secondary EUV light portions towards the phase shift mask as incident EUV light portions;
   detecting reflected incident EUV light portions reflected from the phase shift mask;
   obtaining an interference fringe from the detected, reflected incident EUV light portions; and
   measuring a shift in the obtained interference fringe in relation to a reference interference fringe
   wherein directing the reflected secondary EUV light portions towards the phase shift mask as incident EUV light portions comprises:
   reflecting the secondary EUV light portions back towards the phase shift mask using a first mirror arranged in a horizontal path of the secondary EUV light portions; and
   directing the reflected secondary EUV light portions towards the phase shift mask as the incident EUV light portions using a second mirror arranged above the horizontal path of the secondary EUV light portions.

6. The method of claim 5, wherein reflecting the secondary EUV light portions back towards the phase shift mask comprises:
   controlling a reflection angle for the first mirror.

7. The method of claim 5, wherein directing the reflected secondary EUV light portions towards the phase shift mask as the incident EUV light portions comprises:
   controlling a reflection angle for the second mirror, such that the incident EUV light portions are directed to the phase shift mask at an incident angle ranging from between about 2° to 10° relative to a vertical axis perpendicular to a primary upper surface of the phase shift mask.

8. The method of claim 5, wherein the secondary EUV light portions include at least two (2) secondary EUV light portions.

* * * * *